(12) United States Patent
Chen

(10) Patent No.: US 11,397,197 B2
(45) Date of Patent: Jul. 26, 2022

(54) VOLTAGE DETECTION SYSTEM AND METHOD

(71) Applicant: SIGNIFY HOLDING B.V., Eindhoven (NL)

(72) Inventor: Hong Chen, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 389 days.

(21) Appl. No.: 16/626,599

(22) PCT Filed: Jun. 19, 2018

(86) PCT No.: PCT/EP2018/066265
§ 371 (c)(1),
(2) Date: Dec. 26, 2019

(87) PCT Pub. No.: WO2019/002027
PCT Pub. Date: Jan. 3, 2019

(65) Prior Publication Data
US 2020/0158764 A1    May 21, 2020

(30) Foreign Application Priority Data

Jun. 28, 2017 (WO) ................ PCT/CN2017/090589
Aug. 31, 2017 (EP) ..................................... 17188858

(51) Int. Cl.
*G01R 19/12*     (2006.01)
*H05B 47/18*    (2020.01)
*H05B 47/10*    (2020.01)

(52) U.S. Cl.
CPC ............. *G01R 19/12* (2013.01); *H05B 47/10* (2020.01); *H05B 47/18* (2020.01)

(58) Field of Classification Search
CPC .. G01R 19/0084; G01R 19/12; G01R 29/023; H04B 3/542; H04B 14/026; H04B 14/04;
(Continued)

(56) References Cited

U.S. PATENT DOCUMENTS 7,051,130 B1 * 5/2006 Horowitz ............ G06F 13/4086
710/104
2006/0085660 A1 4/2006 Zagacki
(Continued)

FOREIGN PATENT DOCUMENTS

CN     102455957 A    5/2012
CN     103474966 A    12/2013
(Continued)

*Primary Examiner* — Steven L Yeninas

(57) ABSTRACT

A sensing device is for sensing an operating voltage of a remote device. A communications interface receives communications signals originating from the remote device over a communications bus. A data sampler takes data readings of a communications signal at a predetermined set of timing instants defined by the sensing device. A data metric (such as a duty cycle of high and low states) is obtained from the data readings and from this 5 an operating voltage of the remote device is obtained, based on a relationship between the voltage and the data metric. The invention is based on detecting timing changes which result from voltage changes. In particular, the slope of rising and falling edges of the communications signal are influenced by the voltage level, and this in turn influences the timing of high states (1s) and low states (0s).

15 Claims, 4 Drawing Sheets

(58) Field of Classification Search
CPC .......... H05B 47/10; H05B 47/18; H03K 5/00; H03K 7/08; H03K 9/08
See application file for complete search history.

(56) References Cited

U.S. PATENT DOCUMENTS

| | | |
|---|---|---|
| 2012/0185185 A1 | 7/2012 | Bae et al. |
| 2019/0098727 A1* | 3/2019 | Li .......................... H05B 45/50 |
| 2019/0132929 A1* | 5/2019 | Sturm ..................... H05B 47/18 |

FOREIGN PATENT DOCUMENTS

| | | |
|---|---|---|
| EP | 2739123 A2 | 6/2014 |
| JP | H06-86081 U | 12/1994 |
| JP | 2013-190258 A | 9/2013 |

\* cited by examiner

VOLTAGE DETECTION SYSTEM AND METHOD

CROSS-REFERENCE TO PRIOR APPLICATIONS

This application is the U.S. National Phase application under 35 U.S.C. § 371 of International Application No. PCT/EP2018/066265, filed on Jun. 19, 2018, which claims the benefits of European Patent Application No. 17188858.9, filed on Aug. 31, 2017 and Chinese Patent Application No. PCT/CN2017/090589, filed on Jun. 28, 2017. These applications are hereby incorporated by reference herein.

FIELD OF THE INVENTION

The invention relates to voltage detection for example for electronic circuits, and in particular relates to voltage detection remotely without the need for a local voltage sensor.

BACKGROUND OF THE INVENTION

The voltage level of the supply voltage to a circuit is a key factor for system health, for example for digital lighting systems and other intelligent systems. A voltage fluctuation will impact on the performance of a digital system and will also influence the lifetime of components such as semiconductors and capacitors. A voltage monitoring function is thus more and more popular in intelligent systems.

Currently, the most typical solution is to provide a specific voltage measurement module in a circuit, and to transmit the measurement data to a control system. This solution has good performance since specific circuit designs are used. The measurement module may be based on an analog or a digital voltmeter. A digital voltmeter is widely used in smart systems and applications. It is for example based on an integrating analog-to-digital converter, so that dedicated IC and peripheral circuit have to be used. This solution has cost and reliability concerns due to the hardware complexity. Furthermore, the package size of a voltage measurement module will also be a problem when it needs to be provided within a small form factor system, such as compact luminaire.

There is thus a need for a simple, low cost and flexible solution for measuring a component voltage.

SUMMARY OF THE INVENTION

The invention is defined by the claims.

Examples in accordance with a first aspect of the invention provide a voltage sensing device for sensing an operating voltage of a remote device, comprising:

a communications interface for receiving communications signals originating from the remote device over a communications bus;

a timer;

a data sampler for taking data readings of a communications signal at a set of timing instants defined by the timer; and a processor adapted to determine a data metric from the data readings and to determine from the data metric an operating voltage of the remote device based on a relationship between the operating voltage and the data metric.

This voltage sensing device enables a voltage of a device to be determined by analyzing a communications signal from the device. This communications signal does not need to be generated specifically for communication to the voltage sensing device, but may instead by a signal generated for normal operation within a networked system. The voltage sensing device may thus simply listen in to existing communications. The invention is based on detecting timing changes which result from voltage changes. In particular, the slope of rising and falling edges of the communications signal are influenced by the voltage level, and this in turn influences the timing of 1s and 0s. The data metric is a measure which depends on this timing.

The communications interface is for example a unidirectional interface for only receiving the communications signals. By having a voltage sensing device which only listens in, the existing devices which communicate over the communications bus do not need to be altered.

The device may be adapted to perform a calibration process at a known operating voltage or voltages of the remote device. This may involve providing a suitable communications signal when at the desired voltage for the voltage sensing device to process.

The processor may be adapted to determine an operating voltage by applying the determined data metric to a stored function or look up table representing the operating voltage-data metric characteristics of the remote device. The data metric is in this way converted to a voltage value. The function or look-up table is for example configured by a calibration process, as well as taking into account manufacturer information relating to the remote device.

The processor may be adapted to filter the data readings such that the data metric is derived from data readings which all relate to a 01 transition or a 10 transition of the communications signal (or the data readings could be for either a 01 or a 10 transition). In this way, it can be ensured that the data reading used for generating the data metric derive from a data sequence with equal numbers of 1s and 0s. This provides a form of normalization.

The data metric for example comprises a duty cycle of 1 and 0 values of the communications signal. A slow rise time and a slow fall time may for example (for an inverting gate) lengthen a 1 period and shorten a 0 period of the communication signal. Thus, by determining the effective duty cycle at a particular time, a mapping may be made to the operating voltage.

The timer for example has a clock frequency higher than the bit frequency of the communications signal, for example in the range 2 to 10 times the clock frequency. The clock frequency does not need to be many factors faster than the communications signal, so that the device can be implemented at low cost.

The invention also provides a control system for a lighting system, comprising:

a lighting system controller; and a voltage sensing device as defined above.

The voltage sensing information may for example be used by the lighting system controller. The voltage may be used to detect errors or health status in respect of the remote device, thereby enabling a safety monitoring function. It may be used for monitoring purposes where there are voltage sensitive components such as capacitors.

The voltage sensing device may be integrated into the lighting system controller.

The invention also provides a lighting system, comprising:

a control system as defined above; and a set of luminaires which are connected to the control system by the communications bus.

Examples in accordance with another aspect of the invention provide a voltage sensing method for sensing an operating voltage of a remote device using a voltage sensing device, comprising:

receiving a communications signal originating from the remote device over a communications bus;

taking data readings of the communications signal at a set of timing instants defined by a timer of the voltage sensing device; and determining a data metric from the data readings and determining an operating voltage of the remote device based on a relationship between the operating voltage and the data metric.

This method enables a voltage measurement simply by analyzing a communications signal using a known timer. The method for example comprises receiving the communications signal over a unidirectional interface. This makes the voltage sensing simple and low cost. A calibration process may be performed at a known operating voltage or voltages of the remote device.

The method may comprise determining an operating voltage by applying the determined data metric to a stored function or look up table representing the operating voltage-data metric characteristics of the remote device.

The data metric for example comprises the duty cycle of 1 and 0 values of the communications signal.

The method may be implemented, at least in part, in software.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides a sensing device for sensing an operating voltage of a remote device. A communications interface receives communications signals originating from the remote device over a communications bus. A data sampler takes data readings of a communications signal at a predetermined set of timing instants defined by the sensing device. A data metric (such as a duty cycle of high states and low states) is obtained from the data readings and from this an operating voltage of the remote device is obtained, based on a relationship between the voltage and the data metric. The invention is based on detecting timing changes which result from voltage changes. In particular, the slope of rising and falling edges of the communications signal are influenced by the voltage level, and this in turn influences the timing of high states (1s) and low states (0s).

Figure 1:
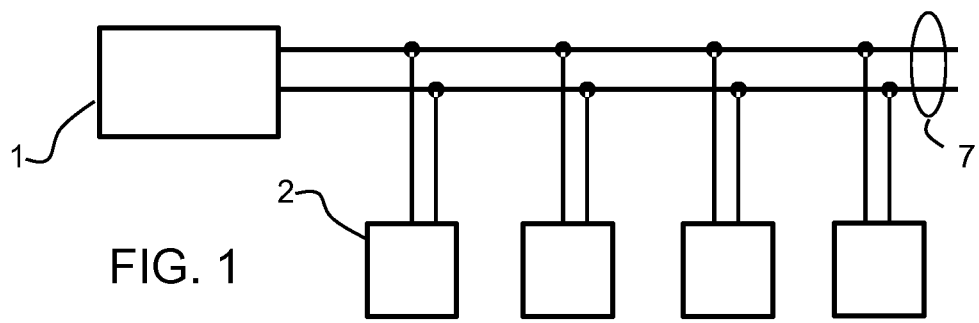
FIG. 1 shows a network of a central control device and a set of remote load devices.

FIG. 1 shows a conventional network of a central control device 1 such as a segment controller and a set of remote load devices 2. The central control device 1 controls and communicates with the remote load devices 2 over a communications interface, in particular a bus 7.

In one example, the overall system is a lighting system, in which the central control device is a main (upstream) lighting controller and the remote load devices are luminaires.

The luminaires typically receive power from a local power supply rather than over a cable from the central controller. This reduces material cost and prevents power loss caused by long power cables. As a result of the different power supply used by the upstream and downstream units, the downstream voltage is unknown to the upstream side.

Figure 2:
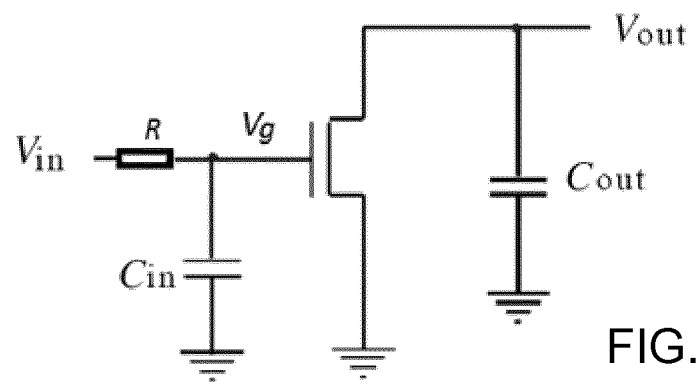
FIG. 2 shows a MOSFET circuit which represents a microcontroller communications interface.

The downstream component typically comprises a microcontroller formed using millions of MOSFETs (Metal-Oxide Semiconductor Field-Effect Transistors). Approximately, the microcontroller communications interface may be regarded as a MOSFET circuit with an equivalent circuit as shown in FIG. 2. An input signal Vin is applied to the gate through a gate resistor R to generate a gate voltage Vg. The output voltage Vout appears at the output (drain). There are several parasitic capacitances between the gate, source and drain approximated by the input and output capacitors Cin, Cout. A higher input voltage Vin causes faster charging for the gate capacitor Cin. Therefore the duration of the signal Vout changes. The gate voltage charges with timing dictated by an RC time constant.

Assuming that the gate threshold voltage (at which the MOSFET will turn on) is Vtrig, then the quantity of electric charge is:

$$Q=C_j*V_{trig}=I*t$$

Cj is a capacitance representing junction capacitances in the device.

Since $I=V(t)/R$, $t=Q*R/V(t)$.

Thus, there is an inverse relation between t and V. A higher voltage means a small rise time (a steeper rise slope) of the gate voltage Vg, which changes the duration t of a high output signal Vout.

Figure 3:
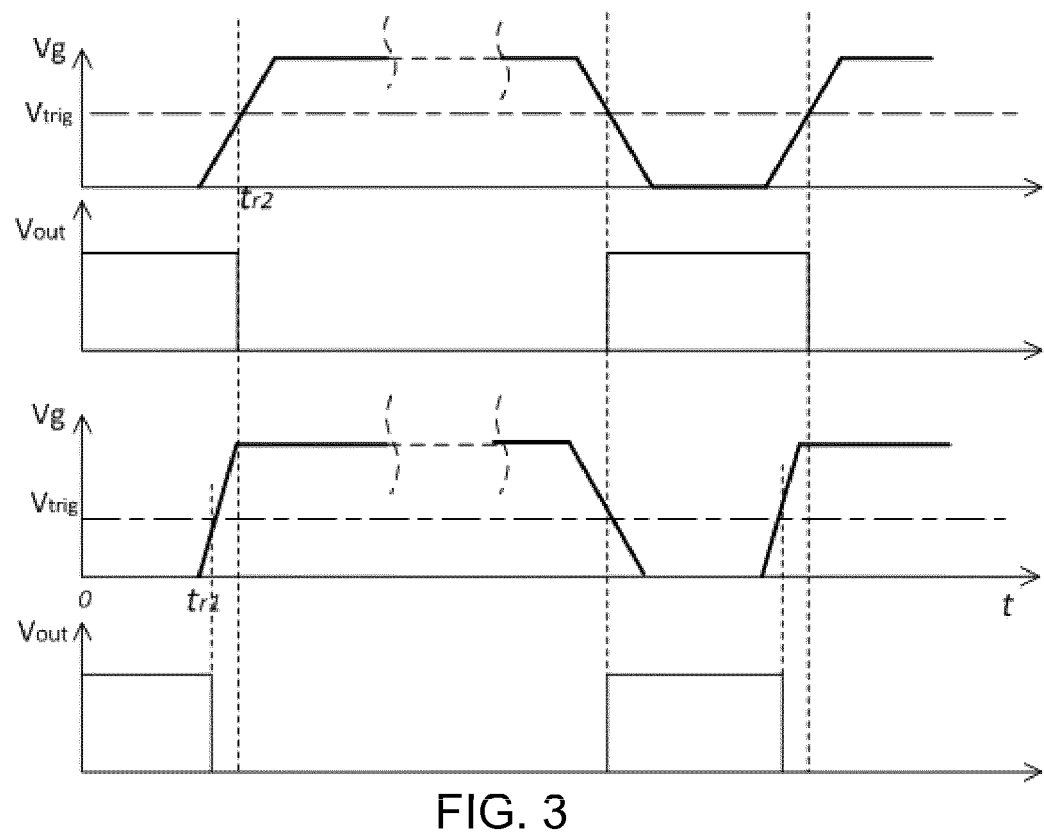
FIG. 3 shows the waveform of a pulse signal.
Figure 4:
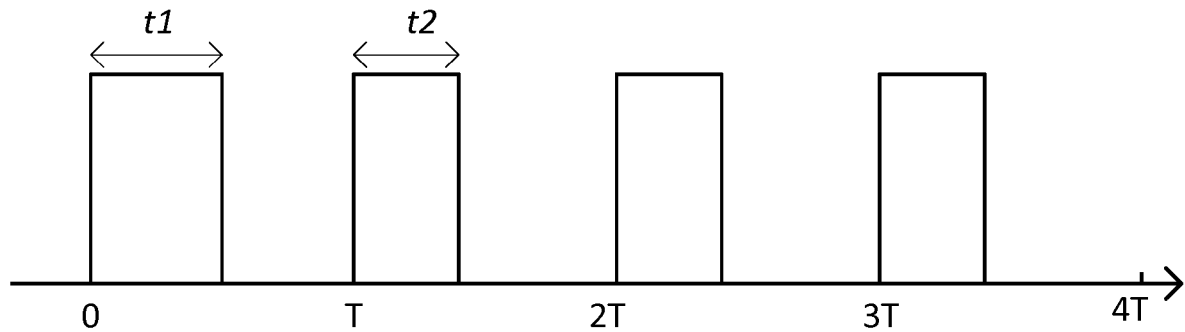
FIG. 4 shows generally how the pulse signal timing is influenced.

A line communication signal comprises a series of signal pulses at a fixed frequency. As shown in FIG. 3, the waveform of a pulse single is not a rectangle but a trapezoid. The rising edge of a pulse is not sharp. FIG. 3 shows the output voltage Vout and the gate voltage Vg for gate voltages with different rise slopes. These different rise slopes are based on a capacitance model of the microcontroller communications interface. The waveforms are for an inverting gate, in that a high gate signal pulls low the drain. This invention is thus based on the recognition that a variable voltage at the downstream controller has an impact on the communication signal. This is shown in FIG. 4, which shows the voltage impact for a communication signal based on the analysis above.

The duration of the pulse signal changes from t1 to t2 (as can be understood from FIG. 3) but the frequency is not changed in this scenario. If the variance of the time t or signal duty cycle D=t/T is known, the voltage change can obtained.

The applicant has proposed (but not yet published) an approach by which a voltage sensing device is based on the measurement of time intervals associated with a chain of repeated communications. The operating voltage of the remote device influences the rise time and fall times of signals sent by the remote device as explained above, and these differences in edge slopes of the signals influence the points in time at which signals are detected at the receiving end. By measuring a time interval associated with a number of repeated sequential communications between the central controller 1 and the remote load device 2, it becomes possible to measure very small time interval values, which for example result from small changes in voltage. The approach does not need modification to the hardware of the remote device, since it simply relies on communication with the remote device, for example a response to a ping message sent from the central controller to the remote load device. The operating voltage of the remote device is thus determined without any change in the existing product, in particular with no additional voltage sensor and associated circuits. The voltage sensing function is instead implemented based on signal communications and statistical analysis.

Figure 5:
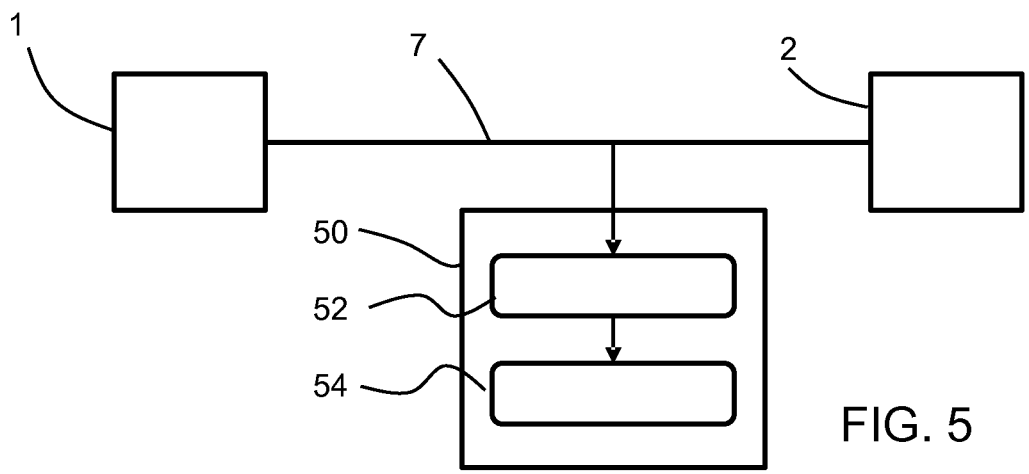
FIG. 5 shows a first example of a voltage sensing device within a system.

FIG. 5 shows the components of a system in accordance with the invention. The system is again based on statistical analysis as in the proposal briefly outlined above, but it further avoids the need for accurate time duration measurements, and also enables a low frequency timer, so that a simple and low cost solution is provided.

The communications bus 7 functions in conventional manner, so that no special communications protocols are required between the central control device 1 and the remote load device 2.

Instead, a voltage sensing device 50 is provided in the form of a small microcontroller unit (MCU) system with a communication interface 52 and a signal measurement and processing unit 54 which is connected to communication bus 7. The voltage sensing device 50 operates in a passive mode, that is, it just "listens" and analyzes the digital (voltage) communications signal from the remote load device (e.g. luminaire) but does not send any signal. It is termed a "voltage sensing device" in that it senses, albeit indirectly, the voltage of the remote load device. The processing performed by the signal measurement and processing unit 54 involves determining a data metric. This is information obtained from the data signal on the communications bus (i.e. bit stream voltage levels) which is influenced by the timing at the remote load device. Using a suitable algorithm, the desired voltage information of the remote load device can be derived.

As will be clear from the description below, the voltage sensing device 50 does not need to perform accurate timing measurements. Rather, it performs data (i.e. voltage) measurement at particular timing instants. Furthermore, these voltage measurements are of a binary bit sequence, so that high accuracy analog circuitry is not needed.

Figure 6:
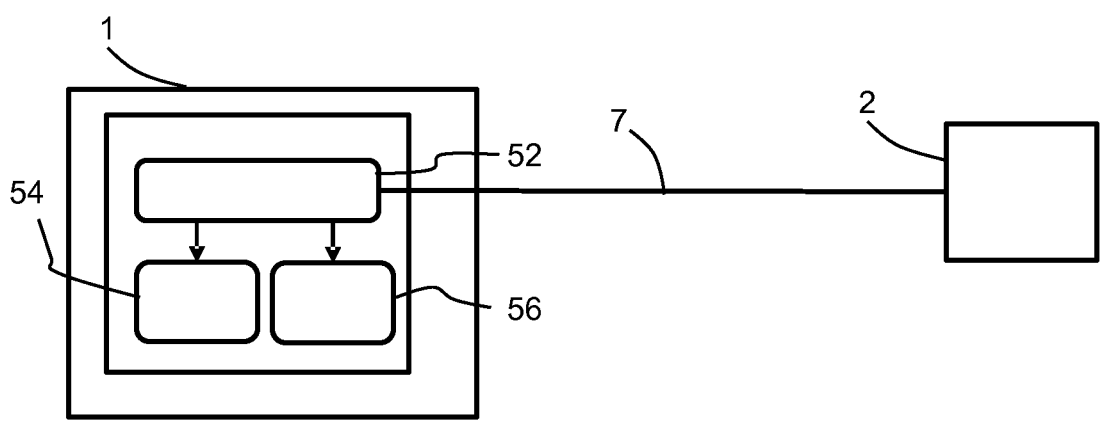
FIG. 6 shows a second example of a voltage sensing device within a system.

The voltage sensing device function can be merged with the central control device 1 as shown in FIG. 6. In this case, a special source code is embedded into the central control device as a soft voltage sensing device, without any hardware change. As shown, the communication interface 52 interfaces with the standard lighting control unit 56 as well as the signal measurement and processing unit 54.

Figure 7:
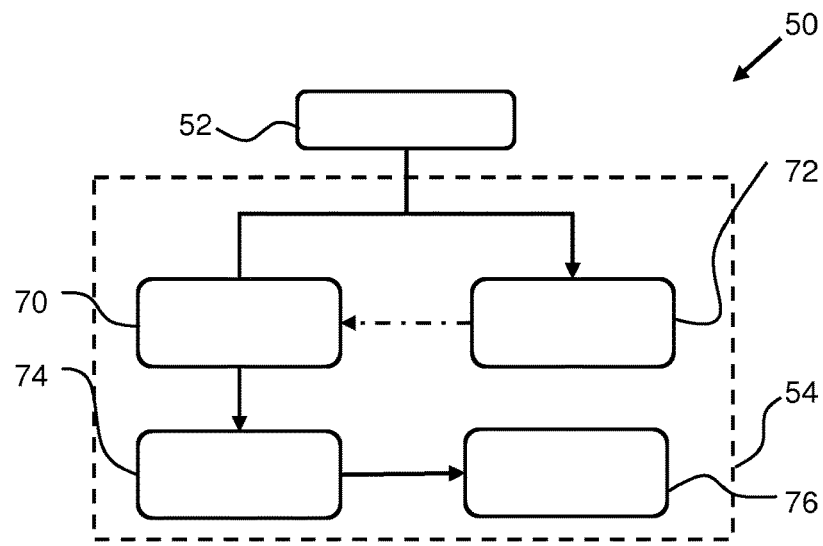
FIG. 7 shows the signal measurement and calculation unit in more detail.

FIG. 7 shows the signal measurement and processing unit 54 in more detail. The unit 54 comprises a timer 70, an address decoder 72 a signal measurement unit 74 and a processor 76. The signal measurement unit functions as a data sampler for sampling the data of a communications signal on the bus 7. These four units form part of a microcontroller unit (MCU). The overall unit is used to measure the variance of the signal duration as explained above, represented by a data metric which is generated by the processor 76.

The processor may then further process the data metric to obtain a voltage value which represents the operating voltage of the remote load device. For this purpose, the determined data metric may be used as input to a stored function or to a look up table representing the operating voltage-data metric characteristics of the remote device.

Although the signal variance is of a nanosecond time level, the need for a very high frequency clock (such as gigahertz clock) is avoided. Generally, the timer clock may be only slightly faster than the clock in the remote load device 2. For example, it may be a 300 kHz clock for the example of communications signal at 115.200 kHz. Higher timer frequencies may be used for improved performance. Thus, there is a trade-off between performance and cost, but the invention can be implemented with a timer clock which is only marginally faster than the clock frequency of the signals carried by the communications bus 7.

A simple communication interface 52 is used to monitor the signal on the communication bus 7. It works in a "listen" only mode only with two functions: one is impedance matching to avoid signal interference when the voltage sensing device 50 is connected to the communication bus 7, and the other is to implement address decoding.

Since the communication signal may come from different remote load devices, the signals are screened so that only the signal from the remote load device being analyzed is detected. The address decoder thus enables signals from unmatched devices to be ignored, and the voltage sensing device 50 functions only when it receives a signal from the desired remote load device.

To measure the time variance of the communication signal, a special algorithm based on probability and statistic theory is used.

The timer clock signal of the signal measurement and processing unit 54 should not be synchronized with the communication signal from remote load device. In this way, it is stochastic for the communication signal when the signal measurement and processing unit 54 starts working.

Figure 8:
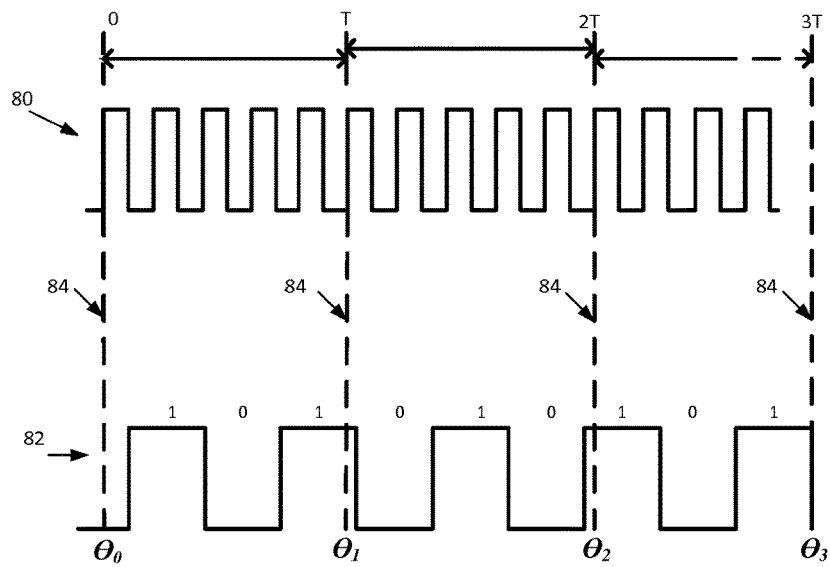
FIG. 8 shows timing signals to illustrate the operation of the voltage sensing device.

FIG. 8 shows a timing diagram.

The top plot 80 shows the clock signal for the timer 70 of the signal measurement and processing unit 54. A communication signal is detected at timing instants 0, T, 2T and 3T of the timer clock signal. In this example, the period T is five times the timer clock period, and it corresponds approximately to one bit period of the communications signal. The bottom plot shows the communications signal 82. The level is detected at timing instants 84. The phases of the communication signal at these times are $\Theta_0, \Theta_1, \Theta_2 \ldots$ etc. Because the signals are non-synchronous, the phase $\Theta$ can be any value within range of [0,360°] according to probability theory.

At the time instants 0, T, 2T, 3T . . . , the signal measurement and processing unit 54 reads its I/O pin status which is determined by communication signal. That is, it detects the signal (voltage) level of the communication signal 82 at the time instants 84, i.e. 0, T, 2T, 3T . . . etc.

After thousands of operations, a table results which shows how many times a data "1" was detected and how many times a data "0" was detected at those time instants. In the short example of FIG. 8, there are four data samples, comprising 3 high levels and 1 low level.

For example, the following tables may result after repeating measurements 10,000 times at two different times:

Remote load device test at first time

| Level | High "1" | Low "0" |
|---|---|---|
| Times | 4600 | 5400 |

Remote load device test at second time

| Level | High "1" | Low "0" |
|---|---|---|
| Times | 4820 | 5180 |

These two examples have duty cycle of the "1" period of 0.460 and 0.482. This duty cycle is a "data metric" in that it is a value which is derived from the data values (1s and 0s) on the communications bus 7.

This difference in duty cycle can then be used to derive the voltage change at the remote load device and in turn a temperature measurement may be obtained.

This statistical analysis will now be discussed further.

With reference to FIG. 3, the time difference to be detected is tr2-tr1. By measuring this time difference, the voltage change can be deduced. The time difference for a single transition is too small to measure accurately. It is for example of the order of a few nanoseconds. Instead, the method is provided based on a chain of communication bits.

The operating voltage of the voltage sensing device is assumed to be fixed and stable. A calibration is also carried out before the voltage measurement. The calibration is used to set the downstream voltage to a known value so that a reference duty cycle can be measured at the voltage sensing device 50. Time variance caused by an unstable downstream voltage can then be measured in the manner explained above.

The sequence of measurements (at time 0, T, 2T, etc.) of the communications signal forms a measurement period. The period can be based on any received message which is sent from the downstream load device onto the bus.

The example of FIG. 8 shows a timer clock of roughly 5 times the frequency of the clock of the downstream load device. More generally, the timer clock may have a frequency of between 2 and 100 times, preferably between 2 and 10 times the frequency of the load device clock. The timer clock is faster than the communications signal so that a level measurement is made within the bit period of the communications signal.

The measurement period T is shown in FIG. 8 as slightly longer than the communications signal bit period. However, the measurement period T could be shorter than the communications signal bit period (for example counting the length of individual 1 and 0 periods of the communication signal rather than only sampling a given 1 or 0 level once). This would require a faster timer clock. Alternatively, the measurement period could be much longer than the communications signal bit period, but this would require a longer measurement time. Preferably, the measurement period is between 1 and 2 times the bit period of the communications signal.

FIG. 8 assumes the measurement of the communications signal in the voltage measurement device is triggered by the rising edge of the time clock signal. Of course, the triggers could equally be at the falling edge of the clock signals.

By analyzing timing of at a large number of timing instants, a statistically significant set is obtained. There are at least ten timing instants recorded, more preferably at least one hundred and even more preferably 1000 or more readings at sequential time instants.

FIG. 8 shows a communications signal in the form of a 10101 . . . pattern. Of course, the data signal may take any form. However, in order for the comparison of the duty cycle (or other data metric) to be valid between different time points, it is required that the communications signal has the same number of 1s and 0s.

This may automatically be the case for some encoding schemes, i.e. the data format of the communications signal may already have equal numbers of 1s and 0s. However, to enable any communications signal to be tolerated, a data-cleaning process may be applied.

The signal measurement unit 74 outputs a set of 0 readings and 1 readings. From this set, only readings which relate to a 01 transition may be passed to the processor 76 for the subsequent statistical analysis. Thus, data collected be the signal measurement unit is only validated if when the communication signal pattern is "01". In this way, a data filtering function is implemented. If a measured signal level is "0", then the next status of the communications signal must be level "1". Similarly, if the measured signal level is "1", the previous status of the communications signal must be "0". In this way, the validated collected data is from a data set with an equal number of 1s and 0s. Thus, if the on and off periods are equal for the communications signal, the duty cycle would be 50%. Changes in the relative durations of the on and off periods will change this duty cycle from 50%.

Of course, the same approach may be based on a 10 transition, or indeed data may be validated if it relates to a 01 transition or a 10 transition.

In this way, the processor is adapted to filter the data readings such that the data metric is derived from data readings which all relate to a 01 transition or a 10 transition (or either of them) of the communications signal.

By having the measurement period T longer than the communications signal bit period, it is known that each 01 (or 10) transition is sampled only once. Thus, each measurement is a unique measurement for a single 01 (or 10) transition, ensuring that the full data set which has been validated is based on an equal number of 1s and 0s.

As mentioned above, a calibration stage is first carried out. As a minimum, the calibration takes place at a known voltage at the remote load device. However, it may involve taking measurements at two or more known voltages.

At the (or each) calibration voltage a number of steps are carried out:

Step 1: The voltage is controlled at the remote load device.

Step 2: The remote load device sends a message.

Step 3: The voltage sensing device 50 performs its measurements.

Step 4: The voltage sensing device 50 stores calibration data in a register for further calculation.

This calibration does not need any involvement of the central control unit. It just needs the remote device to have a controlled voltage, and to be triggered (as part of the installation/commissioning process) to send a message.

After the calibration, the system is ready for use.

This involves performing a voltage measurement, namely when there is an unknown voltage at the downstream (remote load) side.

This involves the voltage sensing device listening for communications from the particular remote load unit, and it then performs the signal measurements.

The measured duty cycle is then converted into a time delay. The relationship between the two is explained with reference to FIG. 3.

A function of operating voltage versus time delay is based on factory information about the specific device, namely the specific device (e.g. part number) combined with the process technology used.

The calibration step enables the voltage versus time penalty function (known from the manufacturer) to be correctly mapped to the actual device, based on one (or more) known points along that function. Deviations from that known point are measured, so that all fixed delays within the system are compensated.

A timing determination at the voltage sensing device is thus able to determine a voltage at the remote unit.

It has been shown that the approach above enables the time change to be distinguished with nanosecond accuracy even with a low frequency clock in the voltage sensing device. A low clock frequency can be used by taking measurements over a longer time period. There is thus a compromise between clock frequency and measurement duration.

The method described above basically detects timing changes which take place at the remote device. A supply voltage change causes rise times (and/or fall times) to change, which in turn are detected as changes in the data metric. Other changes may also provide timing changes. For example, timing changes will result if there are variations in frequency at the remote device. These may be brought about by temperature fluctuations. Such temperature fluctuations are generally smaller and slower than fluctuations caused by voltage.

Thus, the data metric may be processed further in order to ensure voltage changes are responsible, for example by applying high pass filtering.

Voltage fluctuations may be discriminated from other fluctuations. As explained above, the voltage changes cause a duty cycle change at the output voltage signal although the frequency (period) is the same as before. Frequency changes (for example caused by temperature) will instead maintain the same duty cycle. Thus temperature induced changes may be discriminated from voltage induced changes.

Figure 9:
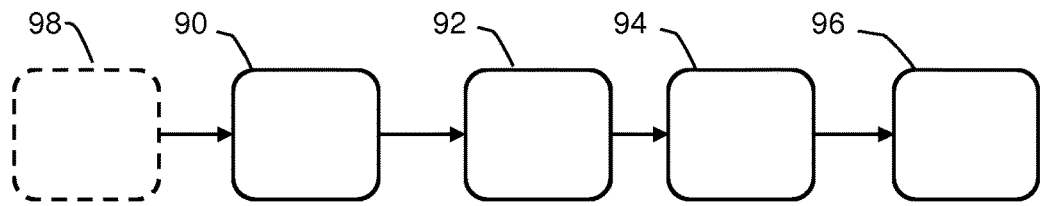
FIG. 9 shows a voltage sensing method.

FIG. 9 shows a voltage sensing method.

In step 90, a communications signal is received originating from the remote device over a communications bus.

In step 92 data readings of the communications signal are taken at a set of timing instants defined by a timer of the voltage sensing device.

In step 94 a data metric is obtained from the data readings.

In step 96 an operating voltage of the remote device is determined based on a relationship between the operating voltage and the data metric.

The method may include a calibration step 98 in which the remote device is known to be at a particular voltage. This provides reference information for calibrating the subsequent voltage measurements.

The system described above makes use of a processor 76 for processing data to determine the voltage.

Figure 10:
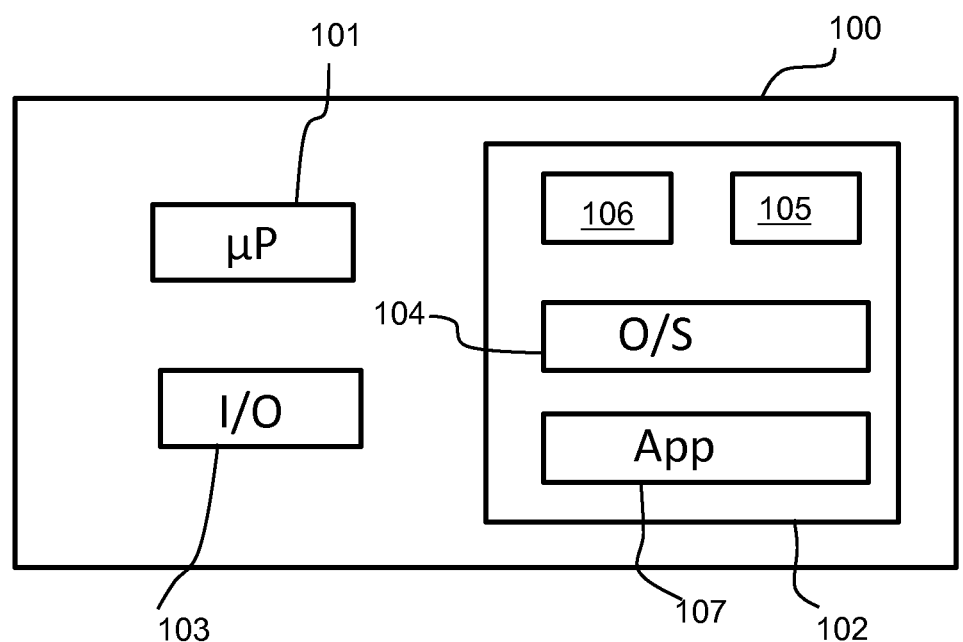
FIG. 10 shows a general computer architecture suitable for implementing the controllers used in the system.

FIG. 10 illustrates an example of a computer 100 for implementing the processor described above.

The computer 100 includes, but is not limited to, PCs, workstations, laptops, PDAs, palm devices, servers, storages, and the like. Generally, in terms of hardware architecture, the computer 100 may include one or more processors 101, memory 102, and one or more I/O devices 103 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components. The processor 101 is a hardware device for executing software that can be stored in the memory 102. The processor 101 can be virtually any custom made or commercially available processor, a central processing unit (CPU), a digital signal processor (DSP), or an auxiliary processor among several processors associated with the computer 100, and the processor 101 may be a semiconductor based microprocessor (in the form of a microchip) or a microprocessor.

The memory 102 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 102 may incorporate electronic, magnetic, optical, and/or other types of storage media. Note that the memory 102 can have a distributed architecture, where various components are situated remote from one another, but can be accessed by the processor 101.

The software in the memory 102 may include one or more separate programs, each of which comprises an ordered listing of executable instructions for implementing logical functions. The software in the memory 102 includes a suitable operating system (O/S) 104, compiler 105, source code 106, and one or more applications 107 in accordance with exemplary embodiments.

The application 107 comprises numerous functional components such as computational units, logic, functional units, processes, operations, virtual entities, and/or modules.

The operating system 104 controls the execution of computer programs, and provides scheduling, input-output control, file and data management, memory management, and communication control and related services.

Application 107 may be a source program, executable program (object code), script, or any other entity comprising a set of instructions to be performed. When a source program, then the program is usually translated via a compiler (such as the compiler 105), assembler, interpreter, or the like, which may or may not be included within the memory 102, so as to operate properly in connection with the operating system 104. Furthermore, the application 107 can be written as an object oriented programming language, which has classes of data and methods, or a procedure programming language, which has routines, subroutines, and/or functions, for example but not limited to, C, C++, C #, Pascal, BASIC, API calls, HTML, XHTML, XML, ASP scripts, JavaScript, FORTRAN, COBOL, Perl, Java, ADA, .NET, and the like.

The I/O devices 103 may include input devices such as, for example but not limited to, a mouse, keyboard, scanner, microphone, camera, etc. Furthermore, the I/O devices 103 may also include output devices, for example but not limited to a printer, display, etc. Finally, the I/O devices 103 may further include devices that communicate both inputs and outputs, for instance but not limited to, a network interface controller (NIC) or modulator/demodulator (for accessing remote devices, other files, devices, systems, or a network), a radio frequency (RF) or other transceiver, a telephonic interface, a bridge, a router, etc. The I/O devices 103 also include components for communicating over various networks, such as the Internet or intranet.

When the computer 100 is in operation, the processor 101 is configured to execute software stored within the memory 102, to communicate data to and from the memory 102, and to generally control operations of the computer 100 pursuant to the software. The application 107 and the operating system 104 are read, in whole or in part, by the processor 101, perhaps buffered within the processor 101, and then executed.

When the application 107 is implemented in software it should be noted that the application 107 can be stored on virtually any computer readable medium for use by or in connection with any computer related system or method. In the context of this document, a computer readable medium may be an electronic, magnetic, optical, or other physical device or means that can contain or store a computer program for use by or in connection with a computer related system or method.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A voltage sensing device for sensing an operating voltage of a remote device, comprising:
   a communications interface for receiving communications signals originating from the remote device over a communications bus;
   a timer;
   a data sampler for taking data readings of a communications signal at a set of timing instants defined by the timer; and
   a processor adapted to determine a data metric from the data readings and to determine from the data metric an operating voltage of the remote device based on a relationship between the operating voltage and the data metric.

2. The device as claimed in claim 1, wherein the communications interface is a unidirectional interface for only receiving the communications signals.

3. The device as claimed in claim 2, adapted to perform a calibration process at a known operating voltage or voltages of the remote device.

4. The device as claimed in claim 1, wherein the processor is adapted to determine an operating voltage by applying the determined data metric to a stored function or look up table representing the operating voltage-data metric characteristics of the remote device.

5. The device as claimed in claim 1, wherein the processor is adapted to filter the data readings such that the data metric is derived from data readings which all relate to:
   a 01 transition; or
   a 10 transition; or
   either of a 10 and 01 transition,
   of the communications signal.

6. The device as claimed in claim 1, wherein the data metric comprises a duty cycle of 1 and 0 values of the communications signal.

7. The device as claimed in claim 1, wherein the timer as a clock frequency higher than the bit frequency of the communications signal, for example in the range 2 to 10 times the clock frequency.

8. The control system for a lighting system, comprising:
   a lighting system controller; and
   a voltage sensing device as claimed in claim 1.

9. The lighting system, comprising:
   a control system as claimed in claim 8; and
   a set of luminaires which are connected to the control system by the communications bus.

10. A voltage sensing method for sensing an operating voltage of a remote device using a voltage sensing device, comprising:
    receiving a communications signal originating from the remote device over a communications bus;
    taking data readings of the communications signal at a set of timing instants defined by a timer of the voltage sensing device; and
    determining a data metric from the data readings and determining an operating voltage of the remote device based on a relationship between the operating voltage and the data metric.

11. A method as claimed in claim 10, comprising receiving the communications signal over a unidirectional interface.

12. The computer program comprising code means which is adapted, when said program is run on a computer, to implement the method of claim 11.

13. The method as claimed in claim 10, further comprising performing a calibration process at a known operating voltage or voltages of the remote device.

14. The method as claimed in claim 10, comprising filtering the data readings such that the data metric is determined from data readings which all relate to:
    a 01 transition; or
    a 10 transition; or
    either of a 10 and 01 transition,
    of the communications signal.

15. The method as claimed in claim 10, wherein the data metric comprises the duty cycle of 1 and 0 values of the communications signal.

* * * * *